(12) United States Patent
Park et al.

(10) Patent No.: US 7,692,310 B2
(45) Date of Patent: Apr. 6, 2010

(54) FORMING A HYBRID DEVICE

(75) Inventors: Chang-Min Park, Portland, OR (US); Shriram Ramanathan, Cambridge, MA (US)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 11/389,860

(22) Filed: Mar. 27, 2006

(65) Prior Publication Data
US 2007/0221961 A1    Sep. 27, 2007

(51) Int. Cl.
*H01L 23/48* (2006.01)
*H01L 23/538* (2006.01)

(52) U.S. Cl. .......... 257/777; 257/421; 257/422; 257/528; 257/776; 257/778; 257/E27.005; 257/E27.024; 257/E21.506; 365/158; 365/171; 365/173; 438/109

(58) Field of Classification Search ........ 257/421, 257/422, 528, 531, 777, E21.506, E27.005, 257/E27.024; 365/158; 438/109
See application file for complete search history.

(56) References Cited

U.S. PATENT DOCUMENTS

| | | | | |
|---|---|---|---|---|
| 5,319,725 | A * | 6/1994 | Buchmann et al. | 385/14 |
| 6,150,724 | A * | 11/2000 | Wenzel et al. | 257/777 |
| 6,608,383 | B2 * | 8/2003 | Yokoyama et al. | 257/761 |
| 2002/0190291 | A1 * | 12/2002 | Hosotani | 257/295 |
| 2003/0080329 | A1 * | 5/2003 | Kurasawa et al. | 257/3 |
| 2005/0021900 | A1 * | 1/2005 | Okuyama et al. | 711/4 |
| 2006/0187864 | A1 * | 8/2006 | Wang et al. | 370/311 |
| 2007/0022274 | A1 * | 1/2007 | Rosner et al. | 712/220 |
| 2007/0194425 | A1 * | 8/2007 | Zingher | 257/686 |

* cited by examiner

*Primary Examiner*—Doa H Nguyen
(74) *Attorney, Agent, or Firm*—Trop, Pruner & Hu, P.C.

(57) ABSTRACT

In one embodiment, the present invention includes a hybrid device having a first die including a semiconductor device and a second die coupled to the first die, where the second die includes a magnetic structure. The first die may be a semiconductor substrate, while the second die may be a magnetic substrate, and the first die may be stacked on the second die, in one embodiment. Other embodiments are described and claimed.

20 Claims, 3 Drawing Sheets

FORMING A HYBRID DEVICE

BACKGROUND

Embodiments of the present invention relate to a hybrid platform, and more particularly to a single package including disparate devices.

Integrated circuits (ICs) are ubiquitous in computer systems, cellular telephones, personal digital assistants (PDAs) and the like. Furthermore, such devices are present in all manners of consumer products as embedded devices. In addition, ICs exist throughout automobile and other technologies as embedded applications. Such semiconductor devices are typically formed on semiconductor wafers using multiple semiconductor processing steps to obtain a finished wafer. The wafer is then cut into multiple die, and IC packages are formed therefrom.

The heart of most modern computer systems is a microprocessor. A microprocessor is formed on a semiconductor die which includes various circuitry including processing elements. Furthermore, most processors include at least some amount of on-board memory. This memory is often in the form of static random access memory (SRAM), which acts as a cache memory to maintain frequently accessed data in close relation to the processing elements. However, since SRAM is a volatile memory, when power is removed from the memory, all data stored therein is lost. Furthermore, the on-board memory consumes a significant amount of device real estate, preventing integration of further processing elements. Today, oftentimes up to 40% of a processor's real estate is consumed by memory. This leads to larger-sized processors, or processors having reduced memory or processing capacity.

Other components such as magnetic devices including magnetic memories (e.g., mass storage devices and other non-volatile memories), inductors, sensors and the like may be present in given systems. Such devices can be formed on magnetic wafers using multiple magnetic processing steps to obtain a finished device.

While these disparate devices (e.g., semiconductor devices and magnetic devices) can be implemented together in a single system, the design, development and formation of finished products, namely semiconductor devices and magnetic devices remain completely separate. As a result, there are limitations to the interaction between semiconductor devices and magnetic devices, as such devices are joined by off-chip interconnects. Additionally, relatively large form factors are needed to employ these disparate devices.

DETAILED DESCRIPTION

In various embodiments, an integrated circuit (IC) may be formed that includes a plurality of devices that may be formed using different processes. That is, in various embodiments multiple die fabricated on different types of substrates and using different processes to obtain different resulting devices may be included in a single IC. For example, in one embodiment a hybrid platform, which is a package including disparate devices, may be formed using at least one semiconductor die and at least one magnetic die located within a single package.

Such a package may take advantage of the processing and operational capabilities of different types of devices to form a hybrid platform that can handle various operations. For example, a semiconductor-magnetic hybrid platform may include at least one semiconductor die and at least one magnetic die. The semiconductor die may include one or more semiconductor devices such as processors, controllers, logic, memory and the like, while the magnetic structure may include active and/or passive structures such as inductors, magnetic devices such as sensors and magnetic-based storage systems such as magnetic random access memory (MRAM) or other such mass storage devices. In various implementations, a magnetic storage device may be a non-volatile memory. In some implementations, a magnetic die and a semiconductor die may be stacked together within a single package to form a hybrid platform.

A hybrid platform may take many different forms in various environments. For example, in one implementation a hybrid platform may include a processor having various processing circuitry (e.g., on the semiconductor die), while the magnetic die may include a magnetic memory that can act as a cache memory for the processor, as well as being able to function as a mass storage device for the hybrid platform. In this way, a hybrid platform may be developed that takes advantage of a small form factor, while achieving significant performance gains. Furthermore, by providing non-volatile cache memory and/or mass storage, improved processing can be realized, particularly in situations in which power is a concern, such as in mobile devices. Still further, since the magnetic memory is non-volatile, when a system is powered off, the memory will still retain its contents, allowing faster startup as prior state data of the processor can be rapidly reloaded into processor structures such as registers and the like.

In another embodiment, a hybrid platform may take the form of an integrated circuit for use in an embedded application. In such an application, the semiconductor device may correspond to an embedded processor, while the magnetic device may include one or more sensors to sense environmental parameters for the application in which the IC is embedded. Of course, other implementations are possible and it is to be understood that the scope of the present invention is not limited by the examples described herein.

Figure 1:
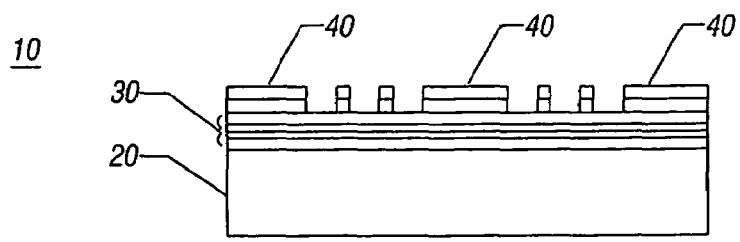
FIG. 1 is a cross-sectional view of a semiconductor device in accordance with one embodiment of the present invention.

Referring now to FIG. 1, shown is a cross-sectional view of a semiconductor device in accordance with one embodiment of the present invention. As shown in FIG. 1, semiconductor device 10 may correspond to any desired device such as a processor, controller, logic, memory, combinations thereof or the like. In various embodiments, semiconductor device 10 may be formed according to a complementary metal-oxide-semiconductor (CMOS) process, although other fabrication processes are possible. Semiconductor device 10 may be formed on a substrate 20, which may be a semiconductor wafer such as a silicon (Si) wafer. Of course, other types of wafers such as silicon germanium (SiGe), gallium arsenide (GaAs) or other semiconductor wafers may be used. Using various semiconductor fabrication processes, different layers may be formed on substrate 20. More particularly, an active region 30 may be formed that includes a plurality of layers that form the desired circuit structures. To enable a connection to other devices, a metal layer 40 may be formed thereon, which includes a plurality of bond pads. In one embodiment, metal layer 40 may be a copper (Cu) layer, although the scope of the present invention is not limited in this regard. As will be described further below, the bond pads of metal layer 40 may be used for bonding to a magnetic device.

Figure 2:
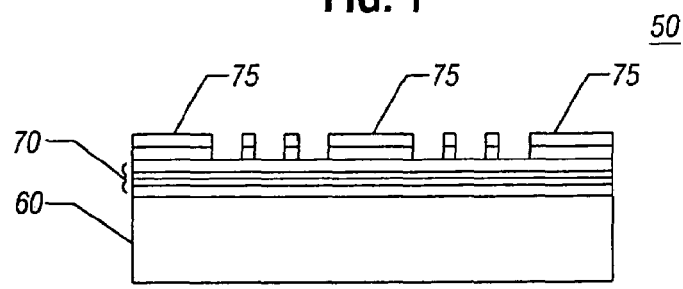
FIG. 2 is a cross-sectional view of a magnetic device in accordance with one embodiment of the present invention.

Referring now to FIG. 2, shown is a cross-sectional view of a magnetic device in accordance with one embodiment of the present invention. As shown in FIG. 2, a magnetic device 50, which may be a sensor, memory or any other desired magnetic circuit, is formed on a magnetic wafer 60. To fabricate magnetic device 50, various layers may be formed on substrate 60. Thus as shown in FIG. 2, an active region 70 may include a plurality of layers interconnected together to provide the desired circuitry. To enable joining of magnetic device 50 to other components, a metal layer 75, which may be a copper layer in some embodiments may be formed above active region 70. Metal layer 75 may be patterned to provide a plurality of bond pads.

Figure 3:
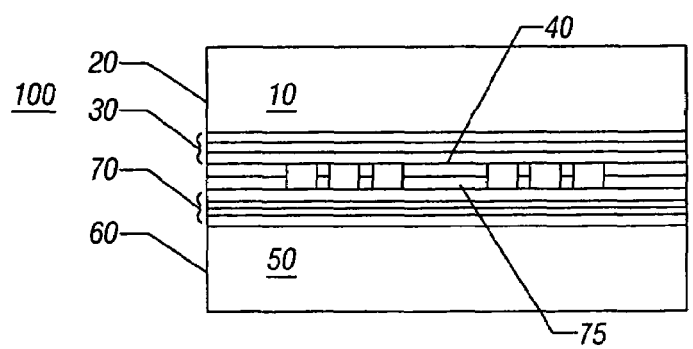
FIG. 3 is a cross-sectional view of a hybrid platform in accordance with one embodiment of the present invention.

To harness the disparate nature of semiconductor and magnetic devices in a single package, one or more semiconductor and magnetic devices may be included in a single package, referred to herein as an IC or a hybrid platform. Referring now to FIG. 3, shown is a cross-sectional view of a hybrid platform in accordance with one embodiment of the present invention. As shown in FIG. 3, hybrid platform 100 may include semiconductor device 10 of FIG. 1 and magnetic device 50 of FIG. 2. Accordingly, the use of the same numerals in FIG. 3 corresponds to the same components discussed above in FIGS. 1 and 2. As shown in FIG. 3, semiconductor device 10 may be stacked above magnetic device 50. More specifically, metal layers 40 and 75 may be placed in contact with each other in desired alignment such that bond pads of magnetic device 50 contact bond pads of semiconductor device 10. In different embodiments, various manners of joining the devices together may be performed. In one embodiment, a metal-to-metal bond may be implemented. As an example, the copper bond pads of both devices may be aligned and semiconductor device 10 and magnetic device 50 may be joined under pressure (and/or via an elevated temperature). In other embodiments, glue bonding or another manner of joining the devices may be realized. Further, while shown with only a single magnetic device and a single semiconductor device in other embodiments of FIG. 3, it is to be understood that in other embodiments additional semiconductor and/or magnetic devices may be present in a single package, either stacked together or placed in different locations within a package.

To provide for improved connectivity of devices, in some embodiments at least semiconductor device 10 may be subjected to a wafer thinning process to thin substrate 20. Such a thinning process may reduce the thickness of the wafer that forms substrate 20 by 50% or more. In some implementations, substrate 20 may be thinned to a thickness of between approximately 100 and 200 microns, although the scope of the present invention is not so limited. To further aid in connectivity, after such thinning, a via process may be implemented to create one or more vias through a backside of substrate 20. In this way, metal vias may be formed to circuitry in active region 30. Then using these vias, additional connections to power, ground, and signal lines may be realized. Of course similar vias may be present in magnetic device 50 as well.

Figure 4:
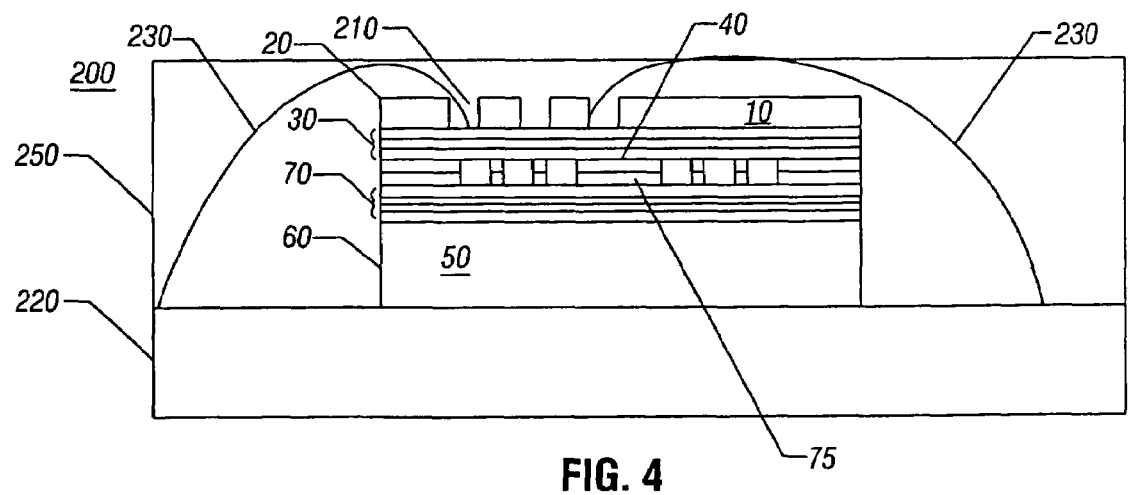
FIG. 4 is a cross-sectional view of a hybrid platform package in accordance with an embodiment of the present invention.

Referring now to FIG. 4, shown is a cross-sectional view of a hybrid platform package in accordance with an embodiment of the present invention. As shown in FIG. 4, hybrid platform 200 may be formed using semiconductor device 10 of FIG. 1 stacked on magnetic device 50 of FIG. 2. The use of the same reference numerals in FIG. 4 as used in FIGS. 1-3 denote similar features. Note that in the embodiment of FIG. 4, semiconductor substrate 20 is thinner, indicating that the wafer used to form semiconductor device 10 has been thinned during fabrication. Furthermore, a plurality of vias 210 (only one of which is enumerated as such in FIG. 4) are present. These through silicon vias (TSVs), which may be deposited with a metal layer, provide additional contacts to active region 30 of semiconductor device 10 (and thus to magnetic device 50).

The embodiment of FIG. 4 further shows a support substrate 220 on which magnetic device 50 is located. Magnetic device may be coupled to substrate 220 via solder bumps, in some embodiments. While not shown in FIG. 4, electrical interconnects from substrate 220 may provide interconnections to, e.g., a socket, circuit board, or the like. Furthermore, a plurality of interconnects 230 such as wire bonds may be coupled to semiconductor device 10 by way of vias 210. Hybrid platform 200 may be encapsulated via a package covering 250, which may be a thermal cover (e.g., an integrated heat spreader (IHS)) in some embodiments. In some implementations, a thermal interface material (TIM) may be sandwiched between semiconductor device 10 and the IHS. While shown with this particular implementation in the embodiment of FIG. 4, it is to be understood that the scope of the present invention is not so limited.

Figure 5:
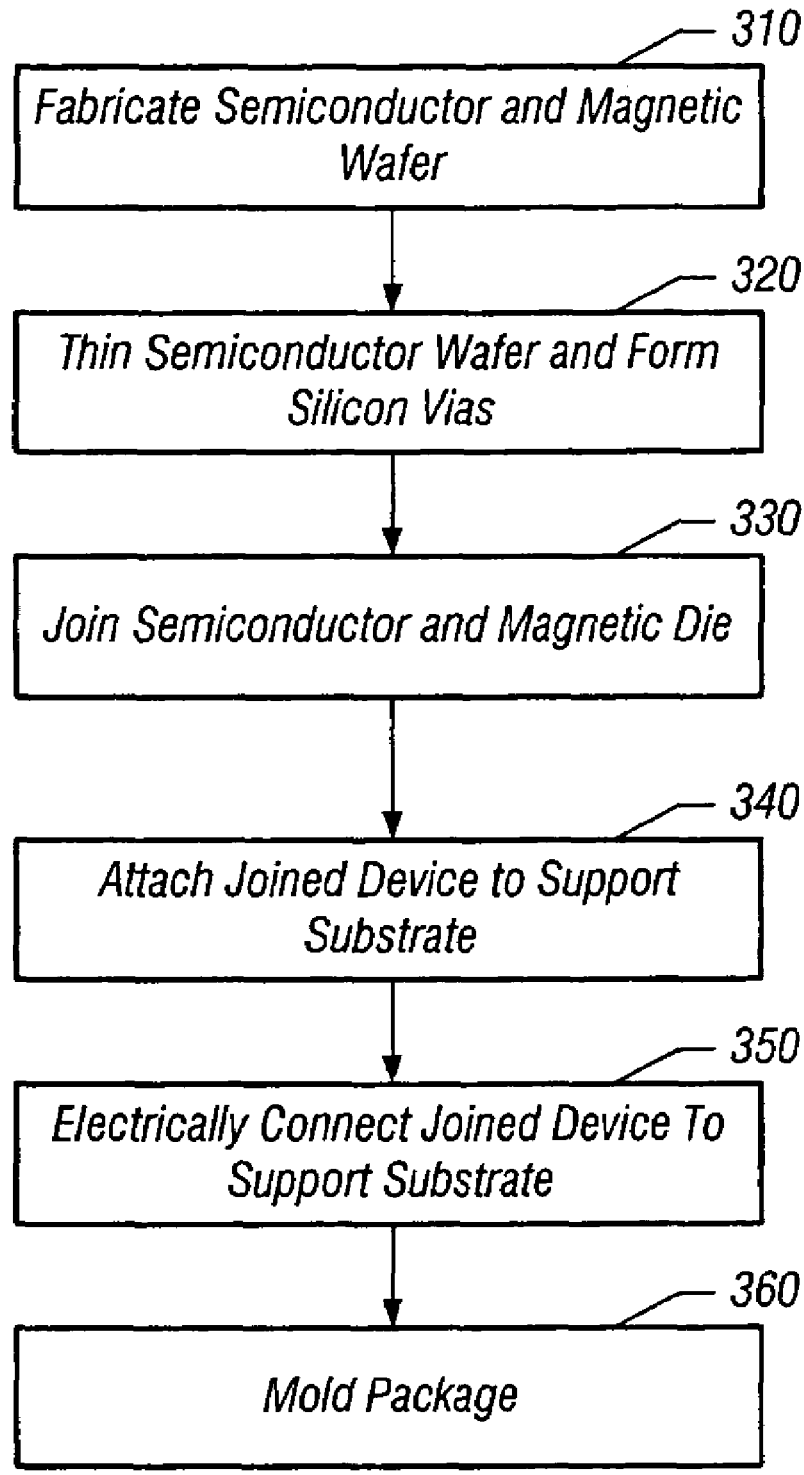
FIG. 5 is a flow diagram of a method of forming a hybrid platform in accordance with one embodiment of the present invention.

Referring now to FIG. 5, shown is a flow diagram of a method of forming a hybrid platform in accordance with one embodiment of the present invention. As shown in FIG. 5, method 300 may begin by fabricating at least two wafers, namely a semiconductor wafer and a magnetic wafer (block 310). For example, a semiconductor device such as a processor and a magnetic device such as memory each may be fabricated in accordance with standard semiconductor and/or magnetic processing techniques.

In certain embodiments, next at least the semiconductor wafer may have additional processing steps performed thereon (block 320). More specifically, global thinning of the wafer and formation of vias may be performed before the wafer is cut into dice. In one embodiment, silicon vias formed in the semiconductor wafer may be metallized. For example, silicon vias formed during fabrication may be metallized, e.g., using an electroplating process such as a copper parallel plating process. In this manner, the silicon vias provide for interconnections between a support substrate (and/or areas in the active region of the semiconductor device) and the backside of the semiconductor.

Still referring to FIG. 5, next the semiconductor and magnetic die may be joined together (block 330). For example, metal bonding may join two devices together. Such joining may take the form of wafer-to-wafer joining, die-to-die joining, or die-to-wafer joining, in various embodiments. In other embodiments, different manners of joining multiple die together in a stacked or other configuration can be realized. The joined device may be attached to a support substrate of the package, e.g., by solder bumps or in another such manner (block 340). Attachment to the support substrate may include formation of electrical connections from the lower die to the support substrate, e.g., using solder bumps or otherwise. In some implementations, a capillary underfill process may be implemented to encapsulate the electrical connections of the lower die with an underfill material.

Electrical connection between the joined device and the support substrate may be made (block 350). For example, a plurality of wire bonds or other electrical connections may be made so that power and/or data can be provided to the joined device from the support substrate. Such connections may be made to the semiconductor device, the magnetic device, or both, in some embodiments.

Of course in other implementations where additional die are desired to be stacked, similar processes for attachment of additional die to a backside of a current top die may be performed. Finally upon completion of the desired stack, the package may be molded (block 360). Additional steps in completing a semiconductor package, e.g., applying a thermal interface material (TIM) and a cover such as an integrated heat spreader (IHS) may also be performed.

Figure 6:
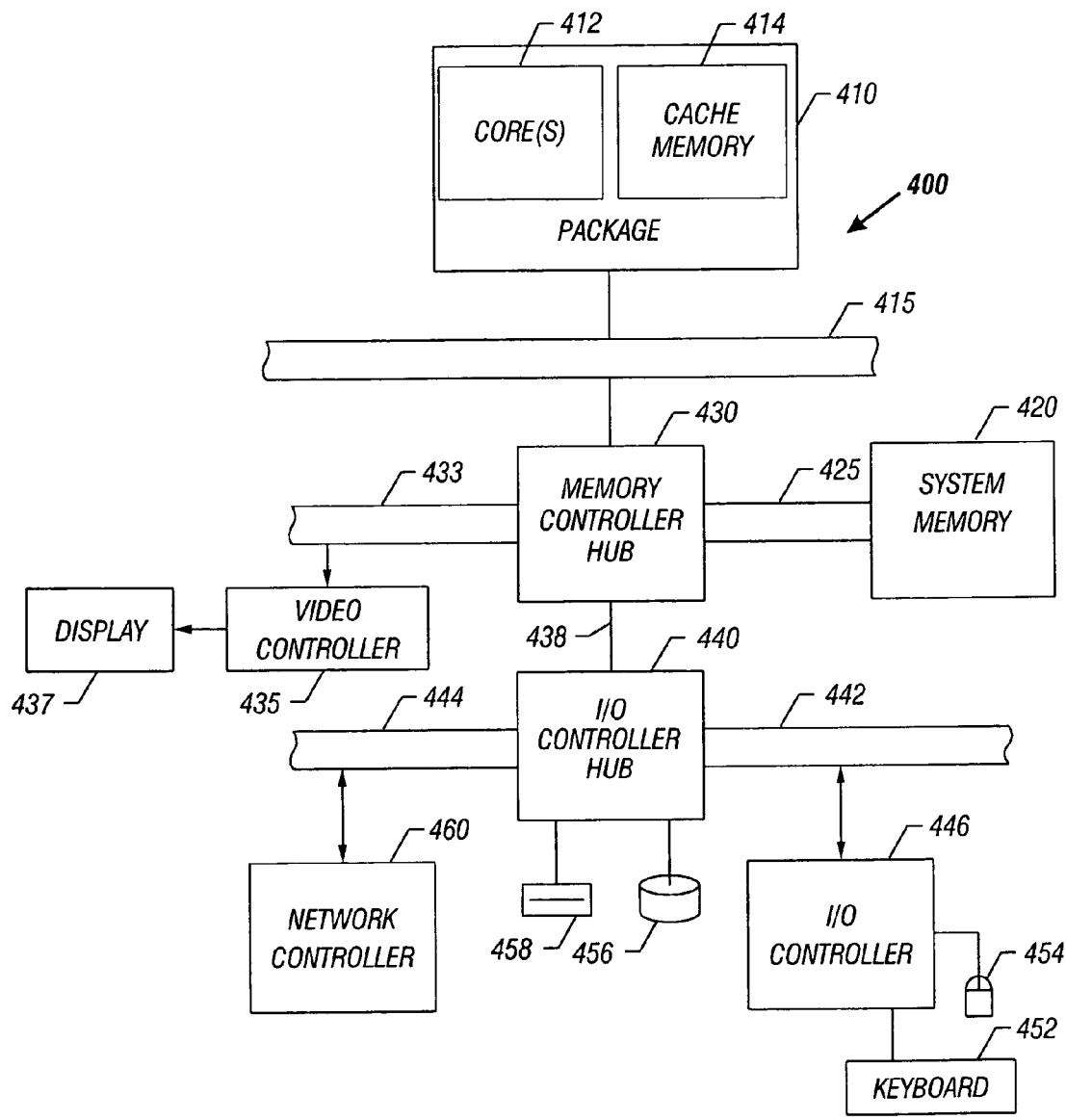
FIG. 6 is a block diagram of a system in which embodiments of the invention may be used.

Hybrid platforms in accordance with an embodiment may be used in various systems. FIG. 6 is a block diagram of a computer system 400 in which embodiments of the invention may be used. As used herein, the term "computer system" may refer to any type of processor-based system, such as a notebook computer, a server computer, a laptop computer, or the like. In some embodiments, a hybrid platform may be particularly suited for a mobile device, as the hybrid integration allows for a small form factor.

Now referring to FIG. 6, in one embodiment, computer system 400 includes a package 410, which may be a hybrid platform. In the embodiment of FIG. 6, package 410 includes a processor 412 which may be a single core or multi-core processor, in different embodiments, and may further include a cache memory 414, which may be a non-volatile memory. Processor 412 may be formed of a semiconductor die, while cache memory 414 may be formed of a magnetic die. Package 410 may be coupled over a host bus 415 to a memory controller hub (MCH) 430 in one embodiment, which may be coupled to a system memory 420 (e.g., a dynamic random access memory (DRAM)) via a memory bus 425. MCH 430 may also be coupled over an Advanced Graphics Port (AGP) bus 433 to a video controller 435, which may be coupled to a display 437. MCH 430 may also be coupled (via a hub link 438) to an input/output (I/O) controller hub (ICH) 440 that is coupled to a first bus 442 and a second bus 444.

First bus 442 may be coupled to an I/O controller 446 that controls access to one or more I/O devices. As shown in FIG. 6, these devices may include in one embodiment input devices, such as a keyboard 452 and a mouse 454. ICH 440 may also be coupled to, for example, a hard disk drive 456 and a digital versatile disk (DVD) drive 458, as shown in FIG. 6. It is to be understood that other storage media may also be included in the system.

Second bus 444 may also be coupled to various components including, for example, a network controller 460 that is coupled to a network port (not shown). Additional devices may be coupled to first and second busses 442 and 444. Although the description makes reference to specific components of system 400, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a semiconductor die including a semiconductor device comprising a multi-core processor;
   a magnetic die coupled to the semiconductor die, the magnetic die including a single substrate comprising both a non-volatile mass storage memory and a non-volatile cache memory, for the multi-core processor; and
   an additional die coupled to the semiconductor die and the magnetic die;
   a semiconductor package formed of the semiconductor die, the additional die, and the magnetic die;
   wherein the semiconductor die is stacked on the magnetic die and an active region of the semiconductor device is bonded to an active region of the magnetic structure by a first plurality of bond pads of the semiconductor device and a second plurality of bond pads of the magnetic device.

2. The apparatus of claim 1, wherein the semiconductor die comprises a semiconductor substrate and the magnetic die comprises a magnetic substrate.

3. The apparatus of claim 1, wherein the cache is to store state data of the processor on a power up event, and the state data is to correspond to a state of the processor at a prior power off event.

4. The apparatus claim 1, wherein the semiconductor device is to provide operational power to the magnetic structure.

5. The apparatus of claim 1, wherein the semiconductor device includes at least one through silicon via to provide power to the magnetic structure from an interconnect of a hybrid platform including the semiconductor device and the magnetic device.

6. The apparatus of claim 1, wherein the magnetic die is stacked on the additional die and the additional die includes an additional semiconductor die.

7. The apparatus of claim 1, wherein the non-volatile mass storage memory includes a first plurality of memory cells and the non-volatile cache memory includes a second plurality of memory cells.

8. The apparatus of claim 1, wherein the non-volatile mass storage memory includes a first memory cell and the non-volatile cache memory includes the first memory cell.

9. A system comprising:
   a hybrid platform including a first substrate having a semiconductor device and a second substrate having a magnetic device;
   a dynamic random access memory (DRAM) coupled to the hybrid platform; and
   wherein the magnetic device includes a magnetic die coupled to the semiconductor device, the magnetic die included in the second substrate which includes both a non-volatile mass storage memory and a non-volatile cache memory.

10. The system of claim 9, wherein the first substrate includes a first plurality of contact pads and the second substrate includes a second plurality of contact pads, the first and second plurality of contact pads joined together.

11. The system of claim 9, wherein the first substrate comprises a semiconductor substrate and the second substrate comprises a magnetic substrate.

12. The system of claim 9, wherein the hybrid platform comprises a package including the first substrate and the second substrate.

13. The system of claim 9, wherein the non-volatile mass storage memory includes a first plurality of memory cells and the non-volatile cache memory includes a second plurality of memory cells.

14. The system of claim 9, wherein the non-volatile mass storage memory includes a first memory cell and the non-volatile cache memory includes the first memory cell.

15. A method comprising:
forming a hybrid semiconductor package including a semiconductor device and a magnetic device by bonding a magnetic die, which includes the magnetic device comprising a single substrate that includes both a non-volatile mass storage memory and a non-volatile cache, and a semiconductor die including the semiconductor device via a plurality of bond pads located on each of the die.

16. The method of claim 15, further comprising creating a plurality of vias on the semiconductor die to enable interconnection between a circuit board and the magnetic device and thinning the semiconductor die before creating the plurality of vias.

17. The method of claim 15, further comprising coupling interconnects from a support substrate of the hybrid package to at least the semiconductor device, the interconnects to provide power to the semiconductor device and the magnetic device.

18. The method of claim 15, further comprising forming the hybrid semiconductor package, wherein the non-volatile mass storage memory includes a first plurality of memory cells and the non-volatile cache memory includes a second plurality of memory cells.

19. The method of claim 15, further comprising forming the hybrid semiconductor package, wherein the non-volatile mass storage memory includes a first memory cell to store mass data and the non-volatile cache memory includes the first memory cell to store cache data when the first memory cell does not store mass data.

20. The method of claim 15, further comprising storing, in the cache, state data of the processor on a power up event, the state data corresponding to a state of the processor at a prior power off event.

* * * * *